March 9, 1965 J. PHILIPS ETAL 3,173,028

SOLID STATE BISTABLE MULTIVIBRATOR

Filed Feb. 13, 1962 3 Sheets-Sheet 1

INVENTORS.
JOHN PHILIPS,
WALTER ZIFFER.
BY
C. L. Menzemer
ATTORNEY

SOLID STATE BISTABLE MULTIVIBRATOR

Filed Feb. 13, 1962 3 Sheets-Sheet 2

INVENTORS.
JOHN PHILIPS,
WALTER ZIFFER
BY
C. L. Menzemer
ATTORNEY

March 9, 1965 J. PHILIPS ETAL 3,173,028

SOLID STATE BISTABLE MULTIVIBRATOR

Filed Feb. 13, 1962 3 Sheets-Sheet 3

INVENTORS.
JOHN PHILIPS,
WALTER ZIFFER.

BY

C. L. Menzemer

ATTORNEY

United States Patent Office 3,173,028
Patented Mar. 9, 1965

3,173,028

SOLID STATE BISTABLE MULTIVIBRATOR

John Philips, Pittsburgh, Pa., and Walter Ziffer, Fairfield, Conn., assignors to Westinghouse Electric Corporation, East Pittsburgh, Pa., a corporation of Pennsylvania
Filed Feb. 13, 1962, Ser. No. 172,975
1 Claim. (Cl. 307—88.5)

This invention relates to a semiconductor device and more particularly it relates to a monolithic semiconductor device that is functionally a bistable multivibrator.

In many computing, data processing and switching operations, bistable multivibrators are required in great numbers. Such devices have been provided heretofore by appropriately interconnected vacuum tubes and associated circuitry, and more recently by using transistors in the prior circuits with appropriate modification. Such devices were improved with the substitution of transistors for vacuum tubes, because transistors are smaller and more rugged, require no filament power, operate at a low supply voltage, dissipate relatively little power, and ordinarily have a service life that exceeds that of heated filament vacuum tubes.

Bistable multivibrators or flip-flops are used in great numbers and accordingly the advantages attending transistor substitution for vacuum tubes are multiplied. However, even transistor-containing devices are complex and bulky in the aggregate, and are subject to material failure in consequence of the many parts and connections that are involved.

It is therefore a primary object of the present invention to provide within a unitary body of semiconductor a plurality of interrelated doped regions including p-n junctions and conductive regions, certain regions operating in a capacitive function, the regions being electrically interconnected primarily through the bulk of the semiconductor body, and the resulting device functioning as a bistable multivibrator.

Other objects will be apparent from the following detailed description of the invention and a specific embodiment of it.

The invention will be most readily understood upon considering its description in conjunction with the attached drawings in which.

In accordance with the present invention, there is provided a monolithic semiconductor device comprising, within a unitary body of semiconductor material, two transistors that are cross-coupled through bases and collectors by coupling circuits. These are provided within a unitary body of a semiconductor material and are interconnected through that body of material. The only external leads that are required are input, power and output leads. The resulting device functions as a bistable multivibrator.

Figure 1:
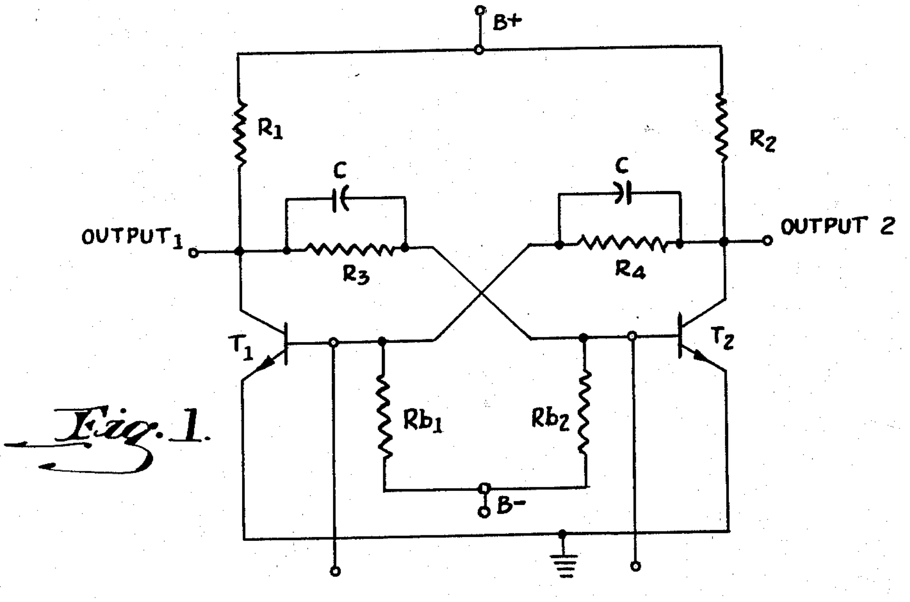
FIG. 1 is a schematic view of a transistorized bistable multivibrator circuit.

The bistable multivibrator of the invention is characterized by two interconnected stages that, as a unit, have two stable states. Such a circuit comprised of separate transistors, capacitors and resistances is shown in FIG. 1. When a B+ D.C. voltage is applied to the circuit, one of the output terminals goes to ground and the other is at B+ voltage. Thus, conduction occurs in one of the transistors while the other is cutoff. This state is a first stable condition in consequence of the variation in tolerance of the circuit components. When a turn-on pulse is applied to the input of the transistor whose collector is at B+, the output of that transistor goes to ground and simultaneously the output of the other transistor goes to B+ voltage. This is a second stable state and this state remains until a turn-on pulse is applied to the collector that is then at B+. The switching occurs by the action of the triggering turn-on pulse in reducing the voltage of the non-conducting transistor, while the RC coupling circuit, connected across the collector of that transistor and the base of the conducting transistor, reduces the base voltage of the conducting transistor thus turning it off. Except for a period when the states of the two transistors are changing, one is off and the other is conducting. In accordance with the teachings of the present invention, the entire function of the transistorized circuit of FIG. 1 is provided in a unitary monolithic body of semiconductor material eliminating, if desired, all leads and connections except input, power and output leads.

For ease of description and understanding, the present invention will be described specifically in terms of preparing a bistable multivibrator in a semiconductor silicon body. It will be understood, however, that in addition to silicon, other semiconductor materials may be used such, for example, as germanium, silicon carbide or a semiconducting compound comprised, for example, of stoichiometric proportions of elements from Group III of the Periodic Table, for example gallium, aluminum and indium, and elements from Group V, for example arsenic, phosphorus and antimony. Examples of suitable III–V stoichiometric compounds include gallium arsenide and indium antimonide. It will also be understood that the silicon or other semiconductor may be processed so that the semiconductivity of the various regions may be reversed in preparing the devices.

Figure 2:
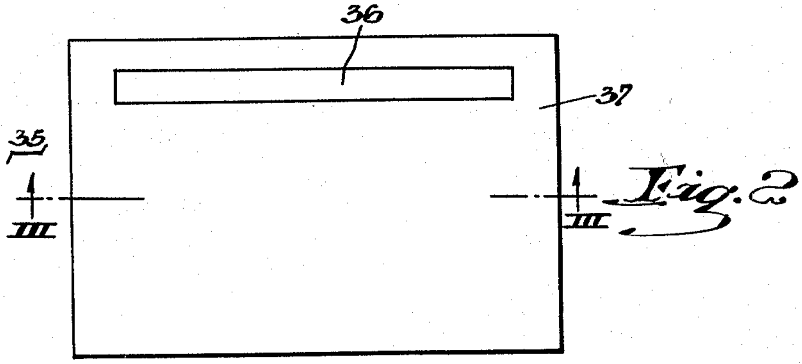
FIG. 2 is a top view of a wafer of semiconductor material used in preparing a device of this invention.
Figure 3:
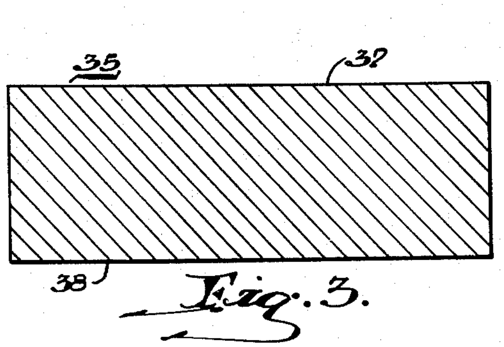
FIG. 3 is a side view in cross section of the wafer of FIG. 2 taken along line III—III of FIG. 2.

Referring to FIG. 2, there is illustrated a single crystal silicon wafer 35 of n-type semiconductivity. The wafer 35 may be prepared by any of many methods available in the art. By way of example, a single crystal silicon rod may be pulled from a melt comprised of silicon and at least one element from Group V of the periodic table, for example arsensic, antimony or phosphorus. A wafer can be cut from the rod with, for example a diamond saw; its surfaces can be smoothed by lapping, etching or the like if desired. A section of a dendritic crystal prepared in accordance with United States patent application Serial Number 844,288, filed October 5, 1959, may also be used as the semiconductor material. The silicon wafer 35 can have a resistivity of about 5 ohm-cm. to 50 ohm-cm. and suitably about 20 to 30 ohm-cm. though the wafer can vary from that resistivity by a factor of 10 or more. The bulk of the wafer makes up the resistance regions of the finished device. The wafer is characterized by a slot 36 near one of its sides that extends entirely through the wafer from its top surface 37 to its bottom surface 38. This slot is conveniently applied by cutting with an ultrasonic machine tool, by an etching procedure or the like.

The wafer is disposed in a diffusion furnace. The hottest zone of the furnace is at a temperature within the range of about 1100° C. to 1250° C. and has an atmosphere of an acceptor doping material, for example, indium, gallium, aluminum or boron. The zone of the furnace within which a crucible of the acceptor material is located at a temperature of from 600° C. to 1250° C., the specific temperature being chosen to insure the desired vapor pressure and surface concentration of diffusant. The acceptor impurity diffuses into the surface of the n-type wafer 35. Since the acceptor impurity will normally diffuse through all sides of the wafer, it may be necessary to mask the surfaces through which no diffusion should occur. Alternatively, where diffusion has occurred through all surfaces, the diffused layers can be removed by abrasion, etching, or the like, where such diffusion is undesired.

Figure 4:
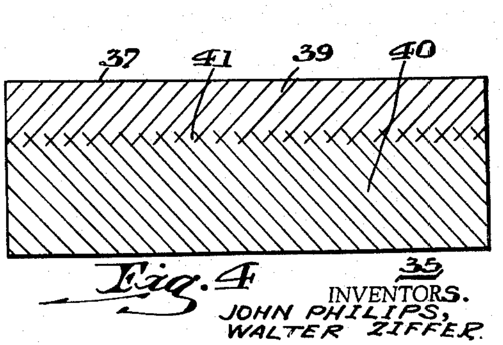
FIG. 4 is a view of the wafer of FIG. 3 being processed in accordance with the teachings of this invention.

After diffusion through all surfaces and removal of the unneeded lower layer, wafer 35 has a p-type region 39 extending from its top surface 37 inwardly as shown in FIG. 4. The remainder of the bulk of the wafer 35 is the n-type region 40. At the internal interface of regions 39 and 40 a first p-n junction 41 is formed.

The depth or thickness of the p-type region 39 produced in the semiconductor wafer 35 is dependent primarily upon the desired design characteristics of the resulting device and the manner of producing the conductivity zones. In addition, it must be deep enough to permit the alloying or fusion of contacts, where they are applied by those techniques, without penetration through the p-type region 39 to the n-type region 40. A depth of about 0.8 mil inwardly from the top surface 37 has been found to be satisfactory in a wafer having a total thickness of about 3 to 10 mils.

Figures 5, 6, 7:
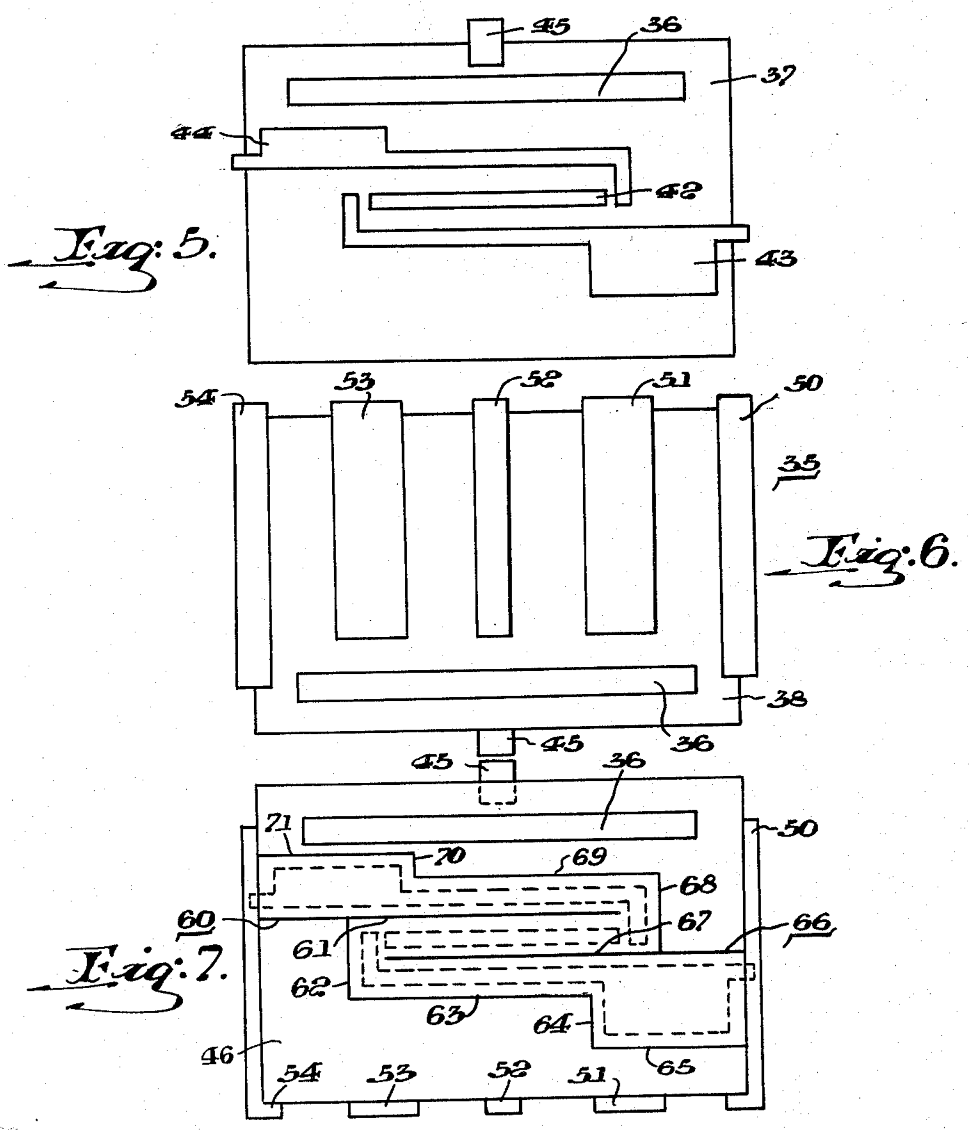
FIG. 5 is a top view of a wafer showing contacts applied thereto.
FIG. 6 is a bottom view of the wafer of semiconductor material showing ohmic contacts on the bottom surface.
FIG. 7 is a top view of a wafer of semiconductor material being processed further in accordance with the teachings of this invention.

Referring now to FIG. 5, an emitter portion 42 of n-type semiconductivity and ohmic contacts 43, 44, and 45 of p-type semiconductivity are formed on the top surface 37 of the wafer 35 by disposing the respective materials, preferably in the form of shaped foils, upon that surface and alloying or fusing the foils thereto by heating in a vacuum of at least $10^{-2}$ mm. Hg, and preferably $10^{-5}$ mm. Hg, at a temperature of about 400° to 700° C. The emitter 42 may be formed, for example, from a foil comprised of at least one suitable n-type material, for example antimony, arsensic and phosphorus and a neutral metal, such as gold. Typical emitter alloys that may be used include an alloy comprised of 99.0 to 99.5 percent gold and 0.5 to 1 percent antimony. The ohmic contacts 43, 44 and 45 on the top surface 37 may be formed from, for example, a foil comprised of at least one suitable p-type material, for example, boron, aluminum, gallium, or indium and a neutral metal, for example gold. Examples of suitable alloys include an alloy of 0.1 percent of boron and the remainder gold. A suitable thickness of the foils used to form emitter 42 and ohmic contacts 43, 44 and 45 as well as those to be mentioned hereinafter, can be determined from a component phased diagram and the thickness of the p-zone 39. Foils of about 0.75 to 1.25 mil and preferably one mil are satisfactory.

As shown in FIG. 6, spaced ohmic contacts 50, 51, 52, 53 and 54 are provided on the bottom surface 38 of the wafer 35. These contacts can be composed of the same or similar material to that used for the emitter 42 mentioned above, since ohmic contact by these foils is to be made to the n-type semiconductor material 40. Preferably, these contacts are fused or alloyed with the wafer 35 in the same operation by which alloying or fusion of the emitter 42 and ohmic contacts 43, 44 and 45 occurs. For ease of connecting leads to the device, each of ohmic contacts 50, 51, 52, 53 and 54 extends slightly beyond the end of the wafer 35. Ohmic contacts 50 and 54 also extend slightly beyond the side edges of wafer 35 to facilitate the flowing thereto of the extensions of ohmic contacts 43 and 44 beyond the edges of the ends of the top surface 37 of the wafer whereby ohmic contacts between foils 43 and 50, on one hand, and 44 and 54, on the other hand, are produced. To facilitate securing the ohmic contacts just mentioned, the ends of foils 43 and 44 can be bent downwardly. It is to be noted that the use of foils of gold and a doping material for ohmic contacts 43, 44, 45 and 50 to 54 is particularly advantageous in that the fusion and alloying that occurs can be carried out well below the melting point of gold.

It will be understood, of course, that the fusion and alloying steps described can be carried out in a jig or other suitable apparatus to ensure that the various foils remain in position during processing. Other suitable techniques to accomplish this result will be apparent to those skilled in the art.

After ohmic contacts and the emitter are provided, the top surface 37 of wafer 35 is coated with an etch resisting masking material 46, for example, Apiezon wax, as shown in FIG. 7. Then a first line 60 composed of segments 61, 62, 63, 64 and 65 is scribed entirely through the wax as shown. A second line 66 composed of segments 67, 68, 69, 70 and 71 also is scribed through the wax coating 46. Scribing is conveniently accomplished with a sharp pointed tool or the like. The resulting scribed lines are then etched with a suitable silicon etchant, for example an etchant comprised, by volume, of 3 parts nitric acid, 1 part hydrofluoric acid and 1 part acetic acid. The etching is continued until the scribed lines are etched entirely through the p-type region 39 into the n-type region 40 whereby grooves are provided. After the etching is terminated, the masking wax 46 is removed from the surface 37 of the wafer. It should be noted that means other than etching may be employed to provide the grooves such, for example, as the use of conventional photoresist techniques.

Figure 8:
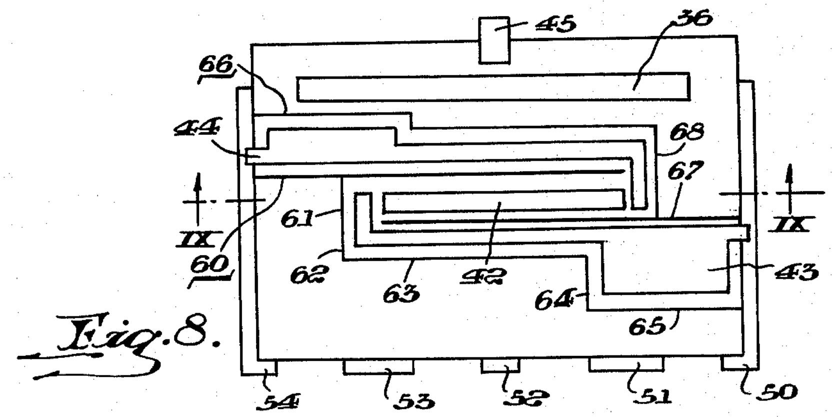
FIG. 8 is a top view of a bistable multivibrator prepared in accordance with the teachings of this invention.

As shown in FIG. 8, the resulting lines or grooves 60 and 66 effectively separate and insulate various parts of the device from one another. Thus, line 66 completely separates the portion of the top p-region 39 that surrounds the slot 36 from the emitter 42 and the ohmic contacts 43 and 44. For this purpose, a segment 67 extends from a side edge inwardly parallel the emitter 42. Segment 68 of line 66 is perpendicular to segment 67 and intersects that segment intermediate the side edge and the end of the emitter 42 near that side edge. Segments 69, 70 and 71 starting at the top of segment 68 extend along ohmic contact 44 and terminate at the other side edge. Groove 60 has its first segment 61 extending from a side edge inwardly and parallel to the emitter 42 on the side opposite the location of segment 67. The remaining segments 62, 63, 64 and 65 surround ohmic contact 43 by extending from the end of segment 62 that is in contact with segment 61 of groove 60 around that contact through to the side edge of wafer 35.

Figure 9:
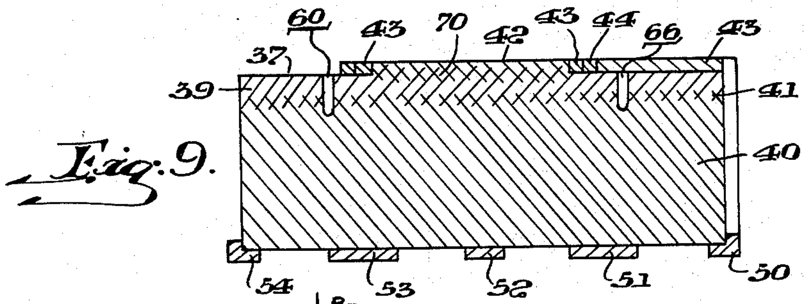
FIG. 9 is a side view in cross-section of the bistable multivibrator of FIG. 8 taken along line IX—IX.

In FIG. 9, a cross-sectional view of the wafer 35 taken along lines IX—IX of FIG. 8 is shown. It will be noted that the n-type emitter 42, upon alloying or fusion with the surface 37 of the wafer 35 provides an additional p–n junction 70 in the device at the interface of the bottom surface of the emitter 42 and the top surface of the p-region 39 of wafer 35. It should also be noted that the grooves 60 and 66 cut entirely through the p-region 39, through the p–n junction 41 into the n-region 40 of the wafer 35.

The processed wafer as just described is now a molecularized or monolithic bistable multivibrator provided within a unitary body of semiconductor material with no external leads necessary other than input, power and output leads. Thus, all of the individual units shown in FIG. 1 are present within the device. Referring jointly to FIGS. 1, 8 and 9, it may be noted that $R_1$ is provided by the resistance of the n-type region 40 between the B+ terminal 52 and the output ohmic contact 53, while $R_2$ is provided by that n-type region between contacts 52 and 51. Resistances $R_3$ and $R_4$, respectively, are provided as the n-type regions between ohmic contacts 53 and 54, and 50 and 51. Resistances $R_{b1}$ and $R_{b2}$ are provided in the semiconductor body between slot 36 and the side near it on each side of the bias (−) contact 45. One transistor is composed of an end of emitter 42 and its junction 70, and portions of the base region p-layer 39, the collector junction 41 and the n-region 40 that are intermediate the emitter 42 and the collector contact 53. The second transistor consists of the other end of emitter 42 and its junction 70 and portions of the base region p-layer 39, the collector junction 41 and the n-region 40 that are between emitter 42 and the collector contact 51. The capacitors are effectively the reverse biased junction 41 between capacitor "plates" ohmic contacts 44 and 53 on the one hand and 43 and 51 on the other. The larger those "plates" the greater the portion of the junction used to serve as the shunting capacity. Being voltage dependent, of course the capacity of any junction can also be changed by a change in the voltage applied.

The invention will be described further by means of the following specific example in which the details are given for purposes of illustration and are not to be construed as limiting.

*Example*

An n-type silicon wafer 200 x 400 x 7 mils, with a resistivity of 20 to 30 ohm-cm., is diffused with aluminum on all surfaces to a depth of 0.8 mil, creating a p-n-p structure, considering it from top to bottom. This is accomplished by heating the wafer in an evacuated quartz tube for about 6 hours in a furnace at about 1200° C. in an atmosphere of aluminum. The aluminum atmosphere is generated by heating a container of aluminum in the furnace at a temperature of about 1200° C. One of the p-layers corresponding to a major surface of the wafer is lapped off. Nine foils about one mil thick each are located on the wafer, four of them being located as shown in FIG. 5, and the remaining foils being located as shown in FIG. 6. The foil indicated in FIG. 5 as numeral 42, the emitter foil, is composed of 0.5 percent antimony and the remainder gold, and all the other foils on the top surface 37 are 0.1 percent boron and the remainder gold. The five foils on the bottom surface are ohmic contacts and are composed of 0.5 percent antimony and 99.5 percent gold. These foils are alloyed to the wafer by heating at about 700° C. in a vacuum of $10^{-5}$ mm. Hg. During alloying, the tips of foils 43 and 44, which extend beyond the respective edges, flow and make ohmic contact with foils 50 and 54, respectively. After alloying, the top surface of the wafer is masked with a thin layer of Apiezon wax. Then lines are scribed in the top surface as shown in FIG. 7 with a sharp pointed tool. Grooves are etched into the wafer along these lines with an etchant comprised, by volume, of 3 parts nitric acid, one part hydrofluoric acid and one part acetic acid. The etching is continued until the scribed lines are etched through the p-aluminum layer to the n-silicon material so that shorting possibilities are avoided and the desired functions are insulated and isolated. After etching is terminated, the wax is removed from the surfaces. Leads are then soldered to the power, input and output terminals.

Figure 10:
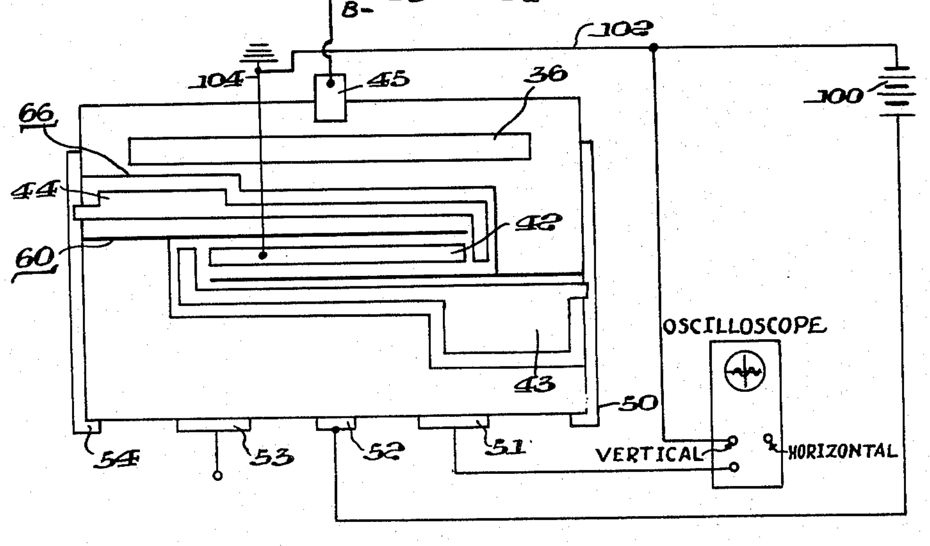
FIG. 10 is a schematic view of the semiconductor device of this invention in circuit with a power source and load.

The device as just described is used as shown in FIG. 10. The positive electrode of a power source 100 is attached to the B+ terminal 52. The emitter 42 is used at ground potential and is also connected to the negative battery terminal by leads 102 and 104. With an oscilloscope connected across an output terminal, e.g. 51, and the negative terminal of the battery, the device evidences its first stable operating state. Upon application of a negative pulse to the conducting transistor, for example through terminal 50 or 54, the device switches to its second stable state, reversing the conduction states of the two transistors. With a B+ voltage of 1.5 volts, a reverse bias voltage of 0.5 volt and a power dissipation of 0.2 mv., a working model was made to trigger at a rate of over 500 kc. and the output voltage was one volt.

Variations can be made in devices of the invention as well as the manner of preparation without departing from its scope. For example, the semiconductor block may be a grown crystal, and the various contacts may be applied by diffusion, evaporation or plating techniques. The resistances can be placed in different portions of the semiconductor block than as shown. If desired, all contacts can be brought to one surface. When all but one contact are brought to one surface, connection of external leads is facilitated and the encasing material is used to contact the single ohmic contact on the bottom surface. The emitter region can be split into two singular parts corresponding largely to the ends of the emitter 42 shown in the drawing. This will necessitate an additional lead, but the electrical characteristics of the resulting device are much improved. Other changes can also be made as long as the resulting device retains its essential functional zones of two active regions or transistors, and the two coupling circuits of parallel capacitors and resistances coupled between the collectors and the bases of the transistors as shown.

While the invention has been described with reference to a particular embodiment, it will be understood that modifications, substitutions and the like may be made therein without departing from its scope.

We claim:

A monolithic bistable multivibrator semiconductor device comprising a unitary body of a semiconductor material, said body containing a top region of a first type of semiconductivity and a bottom region of a second type of semiconductivity, a first p-n junction between the bottom surface of the top region and the top surface of the bottom region, a first and a second ohmic contact disposed on the top surface of the top region, a first region of the second type of semiconductivity formed on the top surface of the top region between the first and second ohmic contacts, a p-n junction between the bottom surface of the first region of second type semiconductivity on the top of the top region and the top surface of the top region of the body, a portion of each of the first and second ohmic contacts extending about opposite edges of the body of semiconductor material and forming first and second ohmic contacts with the bottom surface of the bottom region, a third ohmic contact on the top surface of the top region, a longitudinal slot completely through the body of semiconductor material from its top surface to its bottom surface, said slot being located between the third ohmic contact and one of the first and second ohmic contacts on the top surface of the top region, fourth, fifth and sixth ohmic contacts on the bottom surface of the bottom region, a first groove in the top surface of the top region extending from one side of said body to its other side completely between said slot and said one of said first and second ohmic contacts thereon, a groove segment extending from said first groove inwardly between said first region of second conductivity type on the top surface of the top region of the body and the other of the first and second ohmic contacts thereon, a second groove in the top surface of the top region of the body extending from one side to the other thereof around the other of the first and second ohmic contacts thereon, a groove segment extending from said second groove inwardly between the first of said first and second ohmic contacts and the first region of second type conductivity on the top surface of the top region, said grooves extending from the top surface of the top region into the bottom region of second conductivity type in said body of a semiconductor material.

(References on following page)

References Cited in the file of this patent

UNITED STATES PATENTS

| | | |
|---|---|---|
| 2,985,804 | Buie | May 23, 1961 |
| 3,072,832 | Kilby | Jan. 8, 1963 |

OTHER REFERENCES

Publication I, "Semiconductor Solid Circuits," by Kilby in Electronics, dated Aug. 7, 1959, pages 110–111.

Publication II, "Semiconductor Networks for Microelectronics," by Lathrop et al., in Electronics, dated May 13, 1960, pages 69–78.

Publication III, "Three Approaches to Microminiaturization," by Langford, in Electronics, dated Dec. 11, 1959, pages, 49–52.